(12) United States Patent
Echizenya et al.

(10) Patent No.: US 9,166,075 B2
(45) Date of Patent: Oct. 20, 2015

(54) SOLAR CELL

(75) Inventors: Daisuke Echizenya, Tokyo (JP); Hiroo Sakamoto, Tokyo (JP); Shiro Takada, Tokyo (JP); Hiroaki Morikawa, Tokyo (JP); Hisashi Tominaga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1787 days.

(21) Appl. No.: 11/993,035

(22) PCT Filed: Jun. 27, 2006

(86) PCT No.: PCT/JP2006/312823
§ 371 (c)(1),
(2), (4) Date: Dec. 19, 2007

(87) PCT Pub. No.: WO2007/001004
PCT Pub. Date: Jan. 4, 2007

(65) Prior Publication Data
US 2010/0218811 A1   Sep. 2, 2010

(30) Foreign Application Priority Data

Jun. 29, 2005   (JP) .................. 2005-190306

(51) Int. Cl.
*H01L 31/00* (2006.01)
*H01L 31/0224* (2006.01)
*H01L 31/05* (2014.01)

(52) U.S. Cl.
CPC .... *H01L 31/022425* (2013.01); *H01L 31/0224* (2013.01); *H01L 31/0508* (2013.01); *H01L 31/022433* (2013.01); *Y02E 10/50* (2013.01)

(58) Field of Classification Search
CPC ................. H01L 31/022425; H01L 31/0224; H01L 31/022433; H01L 31/0508; Y02E 10/50
USPC .................... 136/252, 256, 257–261
See application file for complete search history.

(56) References Cited

U.S. PATENT DOCUMENTS 5,411,897 A  *  5/1995  Harvey et al. ................ 438/16
5,609,694 A  *  3/1997  Asai ............................. 136/255

FOREIGN PATENT DOCUMENTS

| JP | 7-135333 | | 5/1995 |
|---|---|---|---|
| JP | 10-144943 | | 5/1998 |
| JP | 2004-31740 | | 1/2004 |
| JP | 2004-031740 | * | 1/2004 |
| JP | 2004-87986 | | 3/2004 |
| JP | 2004-179336 | | 6/2004 |

OTHER PUBLICATIONS

U.S. Appl. No. 12/672,284, filed Feb. 5, 2010, Echizenya, et al.

* cited by examiner

*Primary Examiner* — Matthew Martin
(74) *Attorney, Agent, or Firm* — Oblon, McClelland, Maier & Neustadt, L.L.P.

(57) ABSTRACT

A solar cell includes a silicon substrate, an aluminum electrode that collects electricity from the rear surface of the silicon substrate, and a silver electrode that extracts output from the aluminum electrode. The aluminum electrode includes an opening formed on the rear surface of the silicon substrate. On a side of the opening is formed a notch that recesses parallel to the direction in which principal stress acts in a plane of the silicon substrate. The silver electrode covers at least the opening and the notch of the aluminum electrode.

16 Claims, 12 Drawing Sheets

(a)

(b)

(a)

(b)

SOLAR CELL

TECHNICAL FIELD

The present invention generally relates to a solar cell. The present invention specifically relates to a structure of electrodes on a rear surface of a solar cell.

BACKGROUND ART

Silver paste and aluminum paste are screen printed on the rear surface of a substrate of a solar cell and is fired thereafter. Thus, the aluminum is alloyed with a silicon substrate to form a $p^+$ layer on the rear surface. Because soldering is not possible directly on an aluminum electrode formed of the aluminum paste, a silver electrode is formed of the silver paste on the rear surface of the substrate for taking out the output.

Formed on the rear surface of the solar cell, in a partially overlapping manner, are the aluminum electrode for high output and the silver electrode for taking out the output. This overlapping portion is formed of silicon, silver, and aluminum alloyed together, and is extremely fragile. Therefore, in process such as solder coating, the substrate is easily breakable due to sudden heating and cooling, and also due to stress caused by a difference in thermal expansion coefficients of the soldered substrate and the material of the electrodes, whereby the yield is reduced.

To reduce cost of solar cells, it is necessary to thin substrates that represents a large proportion of the initial cost. However, when substrates are thinned out, solar cells are more likely to break at the fragile part where the three metals are alloyed.

In a conventional solar cell, a plurality of thin lines on the rear surface of the substrate form a silver electrode that takes out the output, and the silver electrode overlaps an aluminum electrode. When the solar cell is heated or cooled suddenly in the process of solder coating or connecting interconnecters, thermal stress is distributed among the thin lines (for example, see Patent Document 1). The electrodes are formed in such a manner that, after paste for a silver electrode is printed on the rear surface of the substrate to form the silver electrode, paste for an aluminum electrode is printed and fired to form the aluminum electrode. Because the silver electrode is fired before printing of the paste for the aluminum electrode, silver and aluminum metals are less likely to react with each other, and formation of a fragile alloy layer of three different metals can be avoided (for example, see Patent Document 1). In another conventional solar cell, quantity of paste applied to form a silver electrode and an aluminum electrode is reduced to avoid formation of an alloy layer of three different metals.

In still another conventional solar cell, a silver electrode includes a protruding portion such that the portion overlaps an aluminum electrode or a portion of it (for example, see Patent Documents 2 and 3).

Patent Document 1: Japanese Patent Application Laid-open No. H10-144943 (p. 3, FIG. 2)
Patent Document 2: Japanese Patent Application Laid-open No. 2004-31740 (pp. 4 and 5, FIG. 1)
Patent Document 3: Japanese Patent Application Laid-open No. 2004-87986 (pp. 4 and 5, FIG. 1)

DISCLOSURE OF INVENTION

Problem to be Solved by the Invention

To reduce cost of solar cells, it is necessary to thin substrates that represents a large proportion of the initial cost. However, when substrates are thinned out in the conventional solar cells mentioned above, problems such as breakage and low yield are likely to occur. If the silver electrode is fired before printing the paste for the aluminum electrode or quantity is reduced of the paste applied to form the silver electrode and the aluminum electrode, the reaction between the silver paste and aluminum paste is less. Thus, resistance between the electrodes increases, which results in low output.

The present invention has been achieved to solve the above problems in the conventional technology and it is an object of the present invention to provide a solar cell with improved mechanical strength without increasing resistance between the electrodes.

Means for Solving Problem

According to the present invention, a solar cell includes a substrate, a first electrode that collects electricity from a rear surface of the substrate, and a second electrode that takes out output from the first electrode. The first electrode includes an opening that is formed on the rear surface of the substrate, and a notch that recesses from the opening in parallel to a direction of principal stress in a plane of the substrate. The second electrode is formed to cover at least the opening and the notch of the first electrode.

According to the present invention, a solar cell includes a substrate, a first electrode that collects electricity from rear surface of the substrate, and a second electrode that takes out output from the first electrode. The first electrode includes an opening that is formed on the rear surface of the substrate, and a notch that recesses from the opening in a direction perpendicular to a direction in which an electric wire extends on the second electrode in a plane of the substrate. The second electrode is formed to cover at least the opening and the notch of the first electrode.

According to the present invention, a solar cell includes a substrate, a first electrode that collects electricity from a rear surface of the substrate, and a second electrode that takes out output from the first electrode. The second electrode includes a base that is formed on the rear surface of the substrate, and a protruding portion that protrudes from the base in parallel to a direction of principal stress in a plane of the substrate. The first electrode includes an opening on central portion of the base of the second electrode, and is formed to cover at least the protruding portion of the second electrode.

According to the present invention, a solar cell includes a substrate, a first electrode that collects electricity from a rear surface of the substrate, and a second electrode that takes out output from the first electrode. The second electrode includes a base that is formed on the rear surface of the substrate, and a protruding portion that protrudes from the base in a direction perpendicular to a direction in which an electric wire extends on the second electrode in a plane of the substrate. The first electrode includes an opening on central portion of the base of the second electrode, and is formed to cover at least the protruding portion of the second electrode.

Effect of the Invention

The present invention improves mechanical strength and yield of the solar cell without increasing resistance between the electrodes.

EXPLANATIONS OF LETTERS OR NUMERALS

Figure 1:
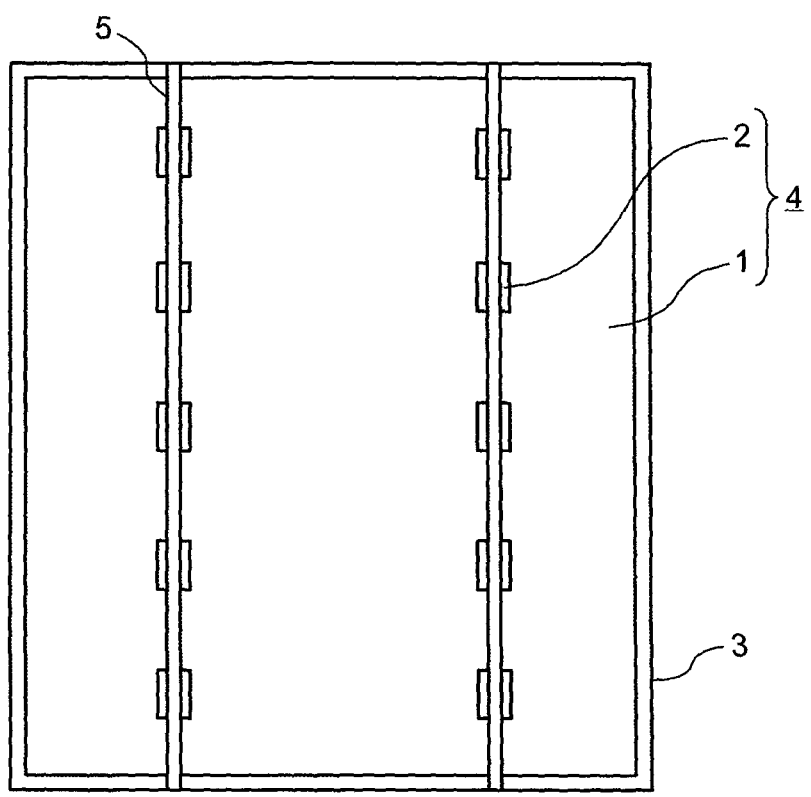
FIG. 1 is a rear view of a solar cell according to a first embodiment of the present invention.

1 Aluminum electrode
1a Opening
1b Notch
2 Silver electrode
2a Base
3 Silicon substrate
4 Electrode
5 Electric wire
6 Border portion
7 Aluminum-paste printing mask
8 Silver-paste printing mask
10 Solar cell
11 Aluminum electrode
11a Opening
12 Aluminum electrode
12a Opening
12b Notch
12c Notch
13 Aluminum electrode
13a Opening
13b Notch
14 Supporting jig
15 Pressing jig
16 Fracture line
17 Aluminum electrode
17a Opening
17b Notch
20 Solar cell
21 Aluminum electrode
21a Opening
22 Silver electrode
22a Base
22b Protruding portion
24 Electrode
101 Aluminum electrode
102 Silver electrode

BEST MODE(S) FOR CARRYING OUT THE INVENTION

First Embodiment

Figure 2:
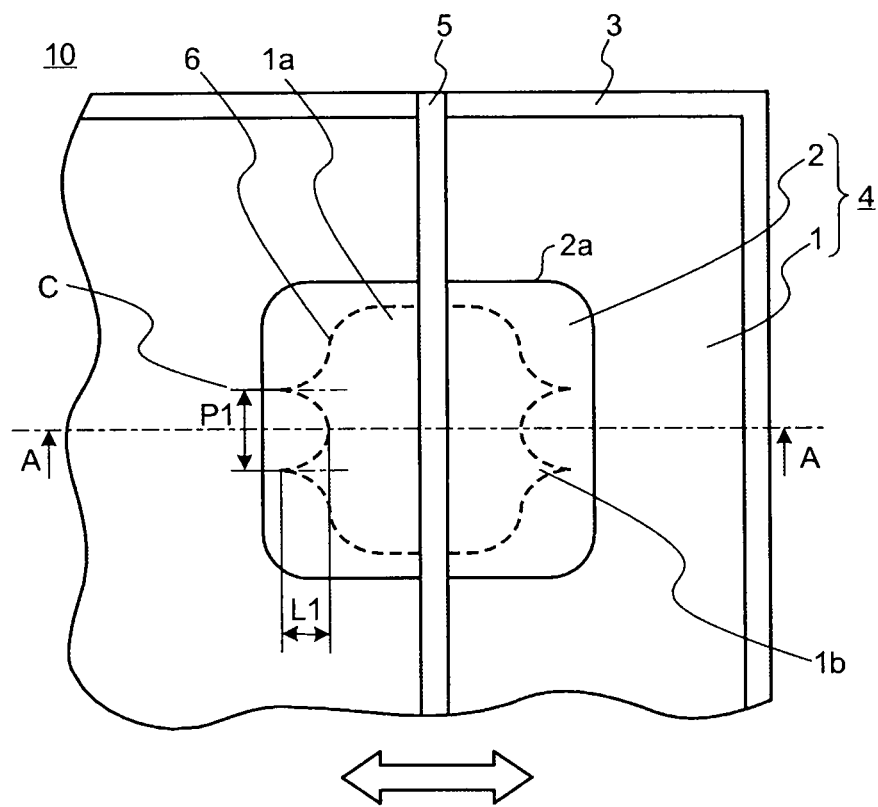
FIG. 2 is a schematic diagram of an electrode on the rear surface of the solar cell according to the first embodiment of the present invention.
Figure 2:
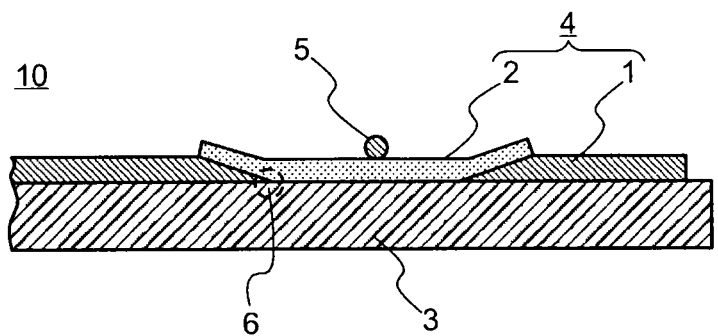

FIG. 1 is a rear view of a solar cell according to a first embodiment of the present invention. FIG. 2 is a schematic diagram of an electrode on the rear surface of the solar cell according to the first embodiment of the present invention. In FIG. 2, (a) is an enlarged view of an electrode on the rear surface of the solar cell, and (b) is a cross section taken along the line A-A of the rear surface of the solar cell shown in (a) of FIG. 2.

Figure 3:
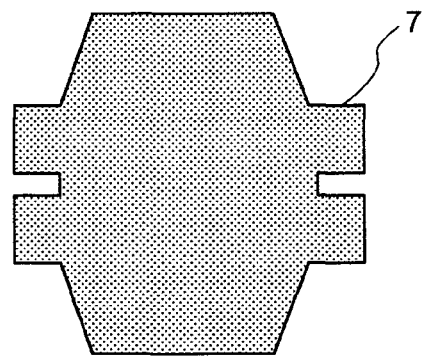
FIG. 3 is a top view of a mask used for printing aluminum paste in the process of forming the solar cell according to the first embodiment of the present invention.
Figure 4:
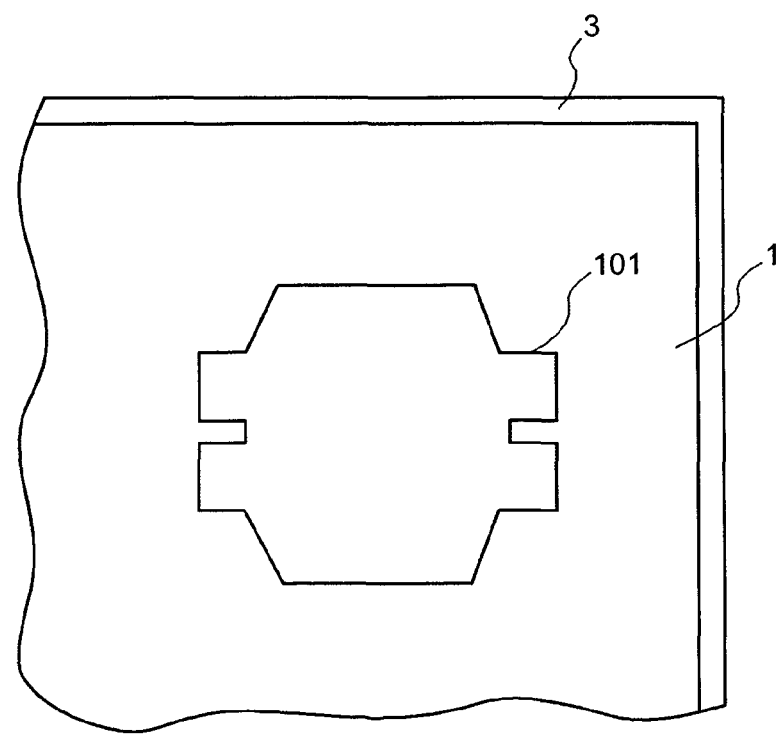
FIG. 4 is a schematic diagram of an aluminum electrode on the rear surface of the solar cell at the time of printing aluminum paste according to the first embodiment of the present invention.
Figure 5:
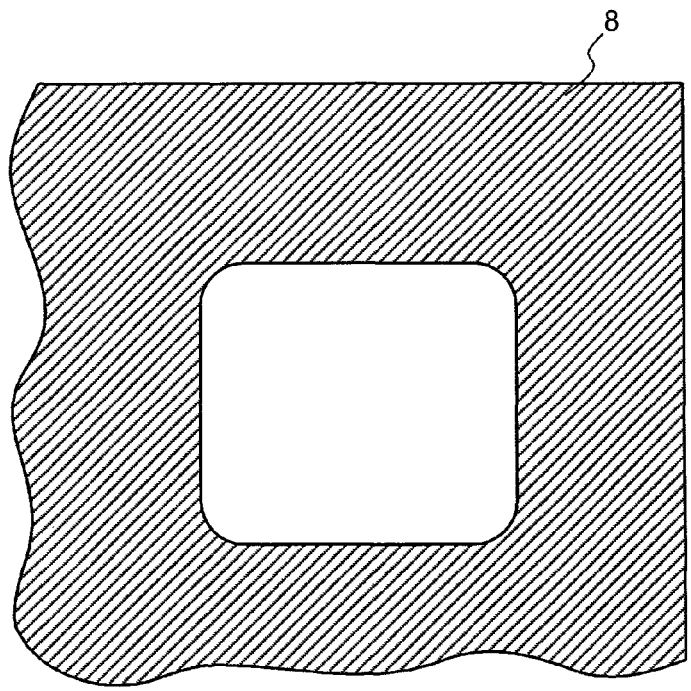
FIG. 5 is a top view of a mask used for printing silver paste in the process of forming the solar cell according to the first embodiment of the present invention.
Figure 6:
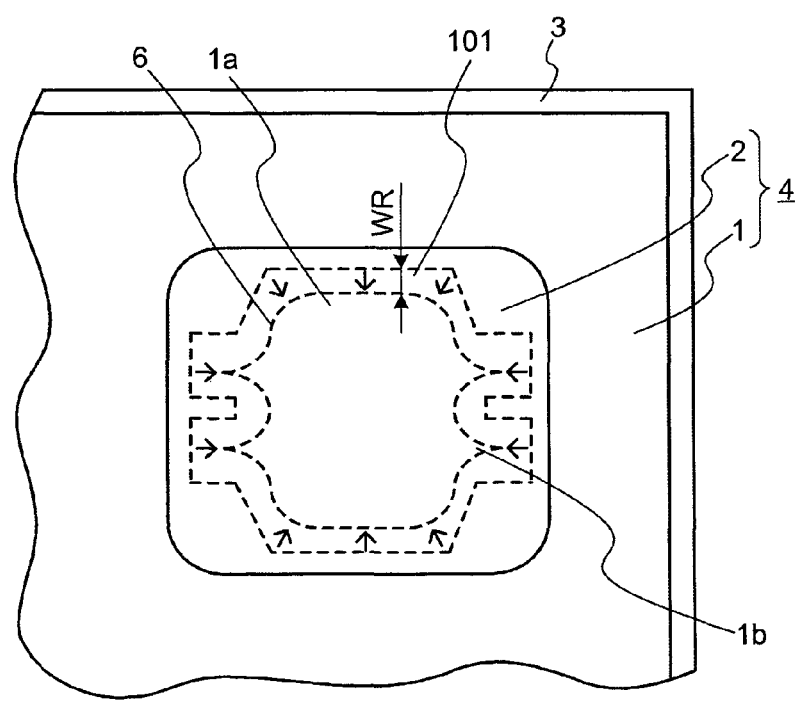
FIG. 6 is a schematic diagram of a silver electrode on the rear surface of the solar cell according to the first embodiment of the present invention.

FIG. 3 is a top view of a mask used for printing aluminum paste in the process of forming the solar cell according to the first embodiment of the present invention. FIG. 4 is a schematic diagram of an aluminum electrode on the rear surface of the solar cell at the time of printing aluminum paste according to the first embodiment of the present invention. FIG. 5 is a top view of a mask used for printing silver paste in the process of forming the solar cell according to the first embodiment of the present invention. FIG. 6 is a schematic diagram of a silver electrode on the rear surface of the solar cell according to the first embodiment of the present invention. Like reference numerals refer to like or corresponding portions throughout the drawings. Details of components appearing throughout the specification are exemplary only, and need not be limited to those mentioned here.

As shown in FIGS. 1 and 2, a solar cell 10 according to the first embodiment of the present invention includes a silicon substrate 3 on the rear surface thereof, an aluminum electrode 1 (first electrode) for collecting electricity from the rear surface of the silicon substrate 3, and a silver electrode 2 (second electrode) for taking out output from the aluminum electrode 1. The aluminum electrode 1 and the silver electrode 2 form an electrode 4. An electric wire 5 made of copper is arranged on the surface of the aluminum electrode 1 and the silver electrode 2 for taking out output from the silver electrode 2.

As shown in FIG. 2, the aluminum electrode 1 has a substantially square opening 1a at the center of the silver electrode 2, and a notch 1*b*, formed on a pair of opposite sides of the opening 1*a*. The notch 1*b* recesses in a concave shape in a direction perpendicular to the direction in which the electric wire 5 is extended in a plane of the silicon substrate 3. The notch 1*b* is of substantially symmetrical about of a central line C as an axis. The central line C of the notch 1*b* formed on one side of the opening 1*a* and that of the notch 1*b* formed on another side of the opening 1*a* are on the same straight line. The silver electrode 2 is formed of a base 2*a* that is substantially square in shape and is formed to cover the opening 1*a* and the notch 1*b* of the aluminum electrode 1 and portion around the opening 1*a* and the notch 1*b*. The silver electrode 2 is arranged in such a manner that it covers the aluminum electrode 1 at the fringe portion for conduction with the aluminum electrode 1. In FIG. 2, P1 is a distance between the central lines C of the notches 1*b* that are adjacent and are on the same side of the opening 1*a*. L1 is length of the notch 1*b* from the opening 1*a* in a direction perpendicular to the direction in which the electric wire 5 is extended.

Explained below is a method of manufacturing the electrode 4 on the rear surface of the solar cell 10 according to the first embodiment.

In the first embodiment, first, aluminum paste is printed on the rear surface of the silicon substrate 3 by using an aluminum-paste printing mask 7 as shown in FIG. 3, and an aluminum electrode 101 is formed as shown in FIG. 4. Next, with a silver-paste printing mask 8 as shown in FIG. 5, silver paste is printed on the rear surface of the silicon substrate 3, on which the aluminum electrode 101 has been formed, and is formed into the silver electrode 2 with the substantially square base 2*a*. Thereafter, the silver electrode 2 is fired to form the electrode 4 on the rear surface of the solar cell 10. After the silver electrode is formed, at the time of firing, the aluminum paste spreads from the form 101, determined by the aluminum-paste printing mask 7, in directions indicated by arrows in FIG. 6. At this time, a fragile part where three metals, silicon, silver, and aluminum are alloyed together is formed near a border portion 6 shown in FIG. 6. The silver electrode 2 directly contacts on the silicon substrate 3 inside the border portion 6. A portion where the silver paste reacts with the aluminum paste having spread from the form determined by the aluminum-paste printing mask 7 when fired, as indicated in FIG. 6, is referred to as reaction width WR. Generally, when the aluminum paste and the silver paste are fired at the same time, the reaction width WR is of 0.3 mm to 1.0 mm. The aluminum paste spreads from the form determined by the aluminum-paste printing mask 7 by the reaction width WR. Thus, the aluminum electrode 1 as shown in FIGS. 2 and 6 is formed.

In the solar cell 10 configured as above, the silver electrode 2 is soldered with the electric wire 5 made of copper as shown in FIG. 2. A plurality of cells are connected together, and are sealed with resin material such as ethylene-vinyl acetate copolymer (EVA) for preventing corrosion. The cells are attached to a reinforced glass to form a solar cell panel. At such time, retentive power necessary for attaching the cells to the reinforced glass and force that shrinks the sealing material due to thermal curing cause bending stress on the electric wire 5 as a base point, and principal stress is generated in a direction perpendicular to the direction in which the electric wire 5 extends. An outline arrow shown in FIG. 2 indicates a direction of the principal stress produced when bending stress is acting on the solar cell 10 with the electric wire 5 as the base point. In the solar cell according to the first embodiment of the present invention, the aluminum electrode 1 has the notch 1*b*, which recesses in a concave shape perpendicular to the direction in which the electric wire 5 is extended in a plane of the silicon substrate 3. In other words, the notch 1*b* is parallel to the direction of the principal stress. Thus, strength against the bending stress acting on the electric wire 5 as the base point is improved.

An aluminum electrode in a form different than the aluminum electrode 1 shown in FIG. 2 is prepared, and bending strength is compared to check the effect of improvement in strength of the solar cell 10 according to the first embodiment of present invention.

Figure 7:
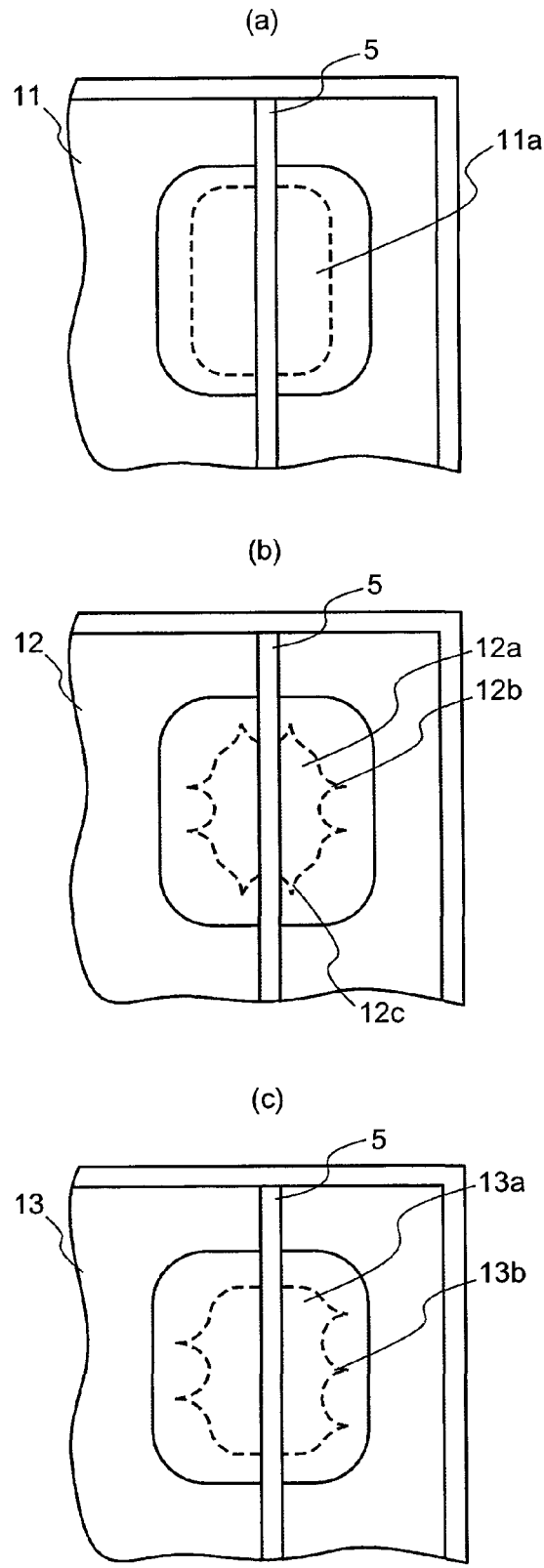
FIG. 7 is a schematic diagram of electrode geometries of a solar cell which has undergone a 4-point bending test.

FIG. 7 is depicts electrodes in different forms prepared for comparison. An aluminum electrode 11 of pattern 1 indicated in (a) of FIG. 7 includes a substantially square opening 11*a*. However, the aluminum electrode 11 of pattern 1 does not include a notch 11*b*. An aluminum electrode 12 of pattern 2 indicated in (b) of FIG. 7 includes a substantially square opening 12*a*, a notch 12*b*, and a notch 12*c*. The notch 12*b* is formed on each of a pair of facing sides of the opening 12*a*, while the notch 12*c* is formed on each of another pair of facing sides thereof. The notch 12*b* recesses in a direction perpendicular to the direction in which the electric wire 5 is extended. The notch 12*c* recesses in a direction parallel to the direction in which the electric wire 5 extended. An aluminum electrode 13 of pattern 3 indicated in (c) of FIG. 7 includes a substantially square opening 13*a*, and a notch 13*b* that is formed on each of a pair of facing sides of the opening 13*a*. The notch 13*b* recesses from each side of the opening 13*a* in a direction perpendicular to the direction in which the electric wire 5 extends. In the aluminum electrode 13 of pattern 3 indicated in (c) of FIG. 7, a central line C of the notch 13*b* formed on one side of the opening 13*a* and that of the notch 13*b* formed on another side of the opening 13*a* are not on the same straight line.

Figure 8:
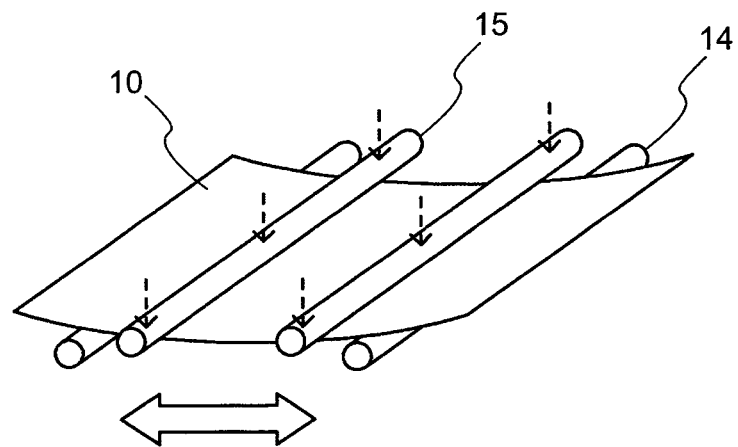
FIG. 8 is a schematic diagram of the 4-point bending tester to measure bending strength.

FIG. 8 is a schematic diagram of a 4-point bending tester to measure bending strength.

In the 4-point bending tester in FIG. 8, the solar cell 10 is set on a supporting jig 14, and a pressing jig 15 is moved in a direction indicated by dotted arrows. Thus, the principal stress acts in a direction indicated by the outline arrow. Using the 4-point bending tester, the 4-point bending test was conducted on the solar cell 10 with the electrodes of patterns 1 to 3 shown in (a) to (c) of FIG. 7 and an electrode of pattern 4 shown in FIG. 2 in such a manner that the principal stress acted in a direction perpendicular to the direction in which the electric wire 5 was extended.

Figure 9:
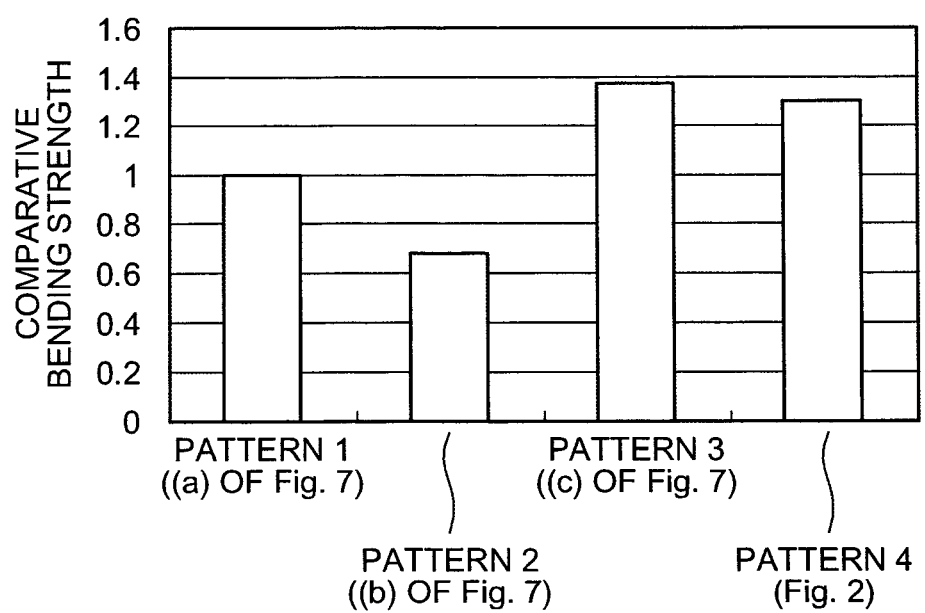
FIG. 9 is a graph of a result of measurement of the bending strength obtained by conducting the 4-point bending test so that principal stress is generated in a direction perpendicular to the direction in which an electric wire is extended.

FIG. 9 is a result of measurement of the bending strength measured during the 4-point bending test conducted so that the principal stress was generated in a direction perpendicular to the direction in which the electric wire 5 was extended. The vertical axis in FIG. 9 indicates comparative bending strength taking bending strength of the solar cell of pattern 1 ((a) of FIG. 7) which includes the aluminum electrode 11 that does not have the notch 11*b* as a reference.

As shown in FIG. 9, as compared to the bending strength of the solar cell including the electrode of pattern 1 ((a) of FIG. 7), the bending strength of the solar cell 10 including the electrode 4 of pattern 4 (FIG. 2) according to the first embodiment of the present invention was 30% higher. As compared to the bending strength of the solar cell including the electrode of pattern 1 ((a) of FIG. 7), the bending strength of the solar cell including the electrode of pattern 2 ((b) of FIG. 7) was 32% lower. As compared to the bending strength of the solar cell including the electrode of pattern 1 ((a) of FIG. 7), the bending strength of the solar cell including the electrode of pattern 3 ((c) of FIG. 7) was 38% higher. Thus, among the four electrodes, the bending strength of the solar cell including the electrode of pattern 4 (FIG. 2) and the bending strength of the solar cell including the electrode of pattern 3 ((c) of FIG. 7) were high.

Figure 10:
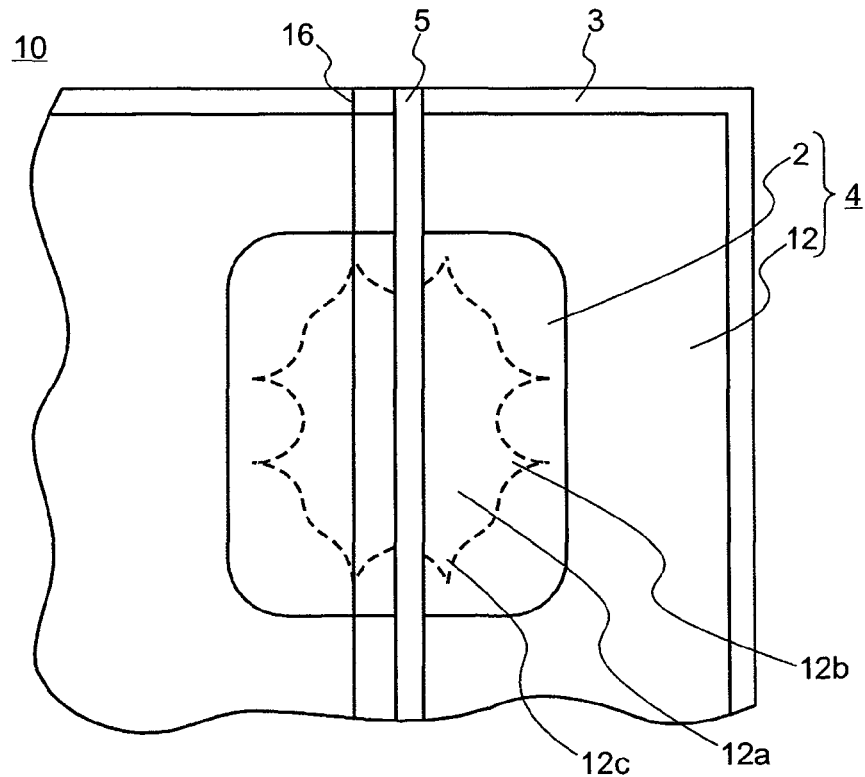
FIG. 10 is a schematic diagram of a fracture in a solar cell of a second pattern.

FIG. 10 is a schematic diagram of a fracture in the solar cell of the second pattern indicated in (b) of FIG. 7.

As shown in FIG. 10, a plurality of fracture lines 16 that connect the notches 12c on opposing sides of the opening 12a were found in the solar cell that includes the aluminum electrode 12, which has the notch 12b that recesses in the direction in which the electric wire 5 is extended in a plane of the silicon substrate 3 of pattern 2 and the notch 12c that recesses in a direction parallel to the direction in which the electric wire 5 is extended in a plane of the silicon substrate 3.

According to the result mentioned above, it is understood that if a notch in the aluminum electrode is parallel to the direction of the principal stress, the bending strength improves. If a notch in the aluminum electrode is perpendicular to the direction of the principal stress, the bending strength deteriorates. Therefore, as in pattern 2 shown in (b) of FIG. 7, if the aluminum electrode 12 has the notch 12b that recesses in a concave shape perpendicular to the direction in which the electric wire 5 is extended in a plane of the silicon substrate 3 and the notch 12c that recesses in a direction parallel to the direction in which the electric wire 5 is extended in a plane of the silicon substrate 3, the strength deteriorates with respect to the principal stress that acts in a direction parallel to the direction in which the electric wire 5 is extended in a plane of the silicon substrate 3.

The solar cell 10 according to the first embodiment, shown in FIG. 2, includes the aluminum electrode 1 that has the opening 1a and the notch 1b that has the recesses in a concave shape parallel to the direction of the principal stress in a plane of the silicon substrate 3. The silver electrode 2 is formed to cover the opening 1a, the notch 1b, and portion around the aluminum electrode 1 and the notch 1b. Therefore, the border portion 6 where the fragile alloy of three different metals is formed is comparatively short lines. The fragile alloy of three different metals is likely to be a point of fracture similarly to a crack in the case of silicon substrate. However, because the border portion 6 is configured of short lines due to the notch 1b, there is no portion that can develop big cracks due to the alloy of three different metals formed in a long line, and a fracture does not occur at the border portion 6. Therefore, the electrode 4 can be prepared without reducing the reaction between the aluminum electrode 1 and the silver electrode 2. Furthermore, the bending strength can be improved without increasing resistance of the electrode 4, whereby yield can be improved. Specifically, when bending stress acts at the electric wire 5 as the base point, because the aluminum electrode 1 includes the opening 1a and notch 1b that is a recesses in a concave shape perpendicular to the direction in which the electric wire 5 is extended in a plane of the silicon substrate 3, the bending strength can be improved without an increase in resistance of the electrode 4, and thereby yield can be improved. In the solar cell 10 according to the first embodiment of present invention, because firing process once after the formation of the silver electrode 2 is sufficient, steps in the manufacturing process can be reduced and cost of manufacturing can be reduced as the firing process is not needed twice, i.e., once after the formation of the aluminum electrode and once after the formation of the silver electrode.

Furthermore, as shown in FIG. 9, the bending strength of the solar cell with the aluminum electrode of pattern 3 indicated in (c) of FIG. 7 is further improved compared with the bending strength of the solar cell 10 with the electrode 4 of pattern 4 shown in FIG. 2. In the solar cell with the aluminum electrode of pattern 3 indicated in (c) of FIG. 7, the notch 13b is formed on both sides of the opening 1a. Because the central line C of the notch 13b formed on one side of the opening 1a and that of the notch 13b formed on another side of the opening 1a are not on the same straight line, there is less possibility of breakage along the line that links each of the notch 13b formed on both sides of the opening 13a, which can result in improving the bending strength and the yield.

The solar cells 10 were prepared with the aluminum electrodes 1 having different numbers of the notches 1b and different distances P1 between central lines of the adjacent notches, and the 4-point bending test was performed to examine difference occurring due to the number of the notches and distances between the central lines of the adjacent notches 1b on one side of the opening 1a shown in FIG. 2. The 4-point bending tester shown in FIG. 8 was used in the 4-point bending test, and the solar cell 10 was set in such a manner that the principal stress was perpendicular to the direction in which the electric wire 5 is extended in a plane of the silicon substrate 3.

Figure 11:
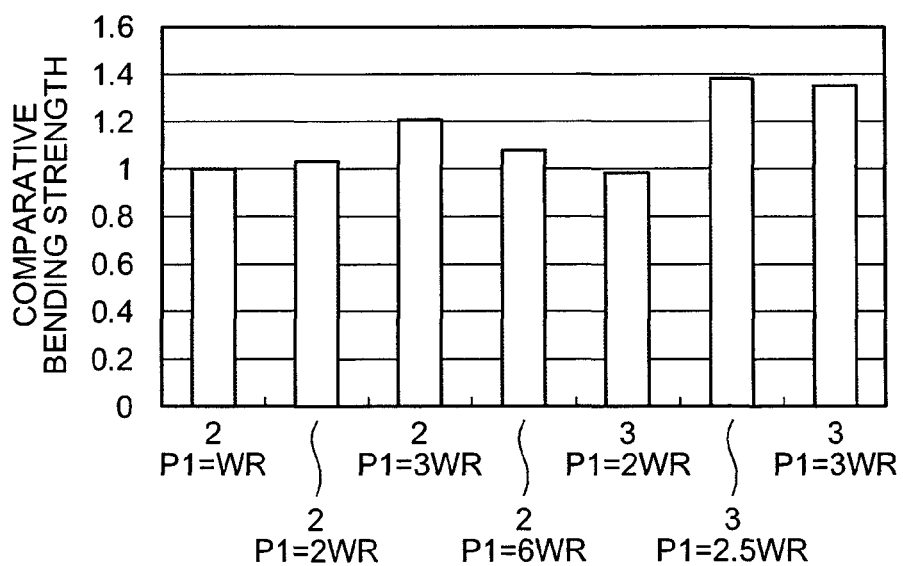
FIG. 11 is a graph of a result of measurement of the bending strength of a solar cell that includes an aluminum electrode having notches on the same surface as an opening of the aluminum electrode, in which the number of the notches and distance P1 between central lines thereof are changed.

FIG. 11 is a graph of bending strength of a solar cell with an aluminum electrode having different numbers of the notches 1b and different distances P1 between the central lines C of the adjacent notches. In FIG. 11, the vertical axis indicates comparative bending strength taking bending strength of the solar cell 10 that includes the aluminum electrode 1 with two notches 1b formed on one side of the opening 1a and distance P1 between the central lines C of the adjacent notches 1b is equal to the reaction width WR shown in FIG. 6.

In FIG. 11, when distance P1 between the central lines C of the adjacent notches 1b was longer than twice the reaction width WR, the bending strength of the solar cell 10 was improved than when distance P1 between the central lines C of the adjacent notches 1b was equal the reaction width WR. However, the bending strength when distance P1 between the central lines C of the adjacent notches 1b is six times the reaction width WR is similar to the bending strength when distance P1 between the central lines C of the adjacent notches 1b is twice the reaction width WR.

When distance P1 between the central lines C of the adjacent notches 1b is equal to or shorter than twice the reaction width WR, those two notches overlap each other, whereby the notches are not able to distribute the stress and, due to which, the bending strength deteriorates. It is necessary to control the reaction by changing reaction-temperature conditions to avoid such occurrence. When distance P1 between the central lines C of the adjacent notches 1b is equal to or longer than six times the reaction width WR, the adjacent notches 1b become far apart, whereby the linear portion of three alloys becomes longer and due to which the bending strength deteriorates. Therefore, distance P1 between the central lines C of the adjacent notches 1b is set longer than twice the reaction width WR and shorter than six times the reaction width WR, so that the bending strength of the solar cell 10 is improved without an increase in resistance of the electrode.

As shown in FIG. 11, the solar cell 10 with three notches 1b on one side of the opening 1a in the aluminum electrode 1 improved bending strength rather than the one with two notches 1b. Therefore, if it is possible to have distance P1 between the central lines C of the adjacent notches 1b longer than twice the reaction width WR, it is better to have as many notches 1b on one side of the opening 1a in the aluminum electrode 1 as possible.

Length L1 of the notches 1b in the aluminum electrode 1 from the opening 1a shown in FIG. 2 is preferred to be longer than the reaction width WR and shorter than three times the reaction width WR. When, in the opening 1a of the aluminum electrode 1, the length of a side parallel to the direction in which the electric wire 5 is extended is longer, the length of the linear portion of the border portion 6 where is formed three different fragile alloys becomes longer. Thus, the border portion 6 becomes easily breakable, which leads to deterioration in the bending strength. Therefore, most preferably, the notches 1b is formed by combining arcs of 90 degrees, and the length L1 of the notches 1b from the opening 1a is half the length of the distance P1 between the central lines C of the adjacent notches 1b. Thus, if the length L1 of the notches 1b from the opening 1a is set longer than the reaction width WR and is shorter than three times length of the reaction width WR, deterioration of the bending strength of the solar cell 10 can be prevented.

In the solar cell 10 according to the embodiment, the aluminum electrode 1 is formed on the rear surface of the silicon substrate 3, and includes the notch 1b that recesses in a concave shape perpendicular to the direction in which the electric wire 5 is extended in a plane of the silicon substrate 3. However, the principal stress that acts on the solar cell 10 is not limited to the bend at the electric wire 5 as the base point, and direction of the principal stress, which is the main cause of damage to the solar cell 10, varies according to the form and usage of the solar-cell panel. Therefore, by obtaining the direction of the principal stress, and providing the aluminum electrode 1 with the notches 1b that recess in a concave shape parallel to the direction of the principal stress in a plane of the silicon substrate 3, the bending strength of the solar cell 10 can be improved. The direction of the principal stress, which is the main cause of damage to the solar cell 10, can be obtained by using versatile finite element technique analysis software. According to the first embodiment, the case of bending deformation is assumed and direction of the principal stress is constant, and therefore, the notches are formed on both sides of the electrode. However, for example, in some cases, thermal stress, generated at the time of soldering an electrode to a copper plate that connects the solar cells, changes according to the form of the copper plate, and the principal stress is concentrated on one side of an electrode or the principal stress is generated on four sides taking the electrode as a center. The direction of the principal stress of the thermal stress can also be obtained by using versatile finite element technique analysis software. The bending strength of the solar cell 10 can be improved by setting the electrode that includes the notches, which recess in a concave shape in the direction parallel to the direction of the principal stress, on a side in which the thermal stress is generated.

Figure 12:
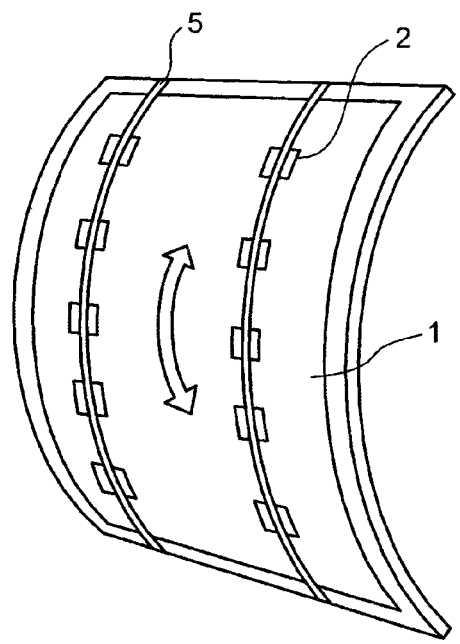
FIG. 12 is a perspective view of a solar-cell panel that has a curved surface.
Figure 13:
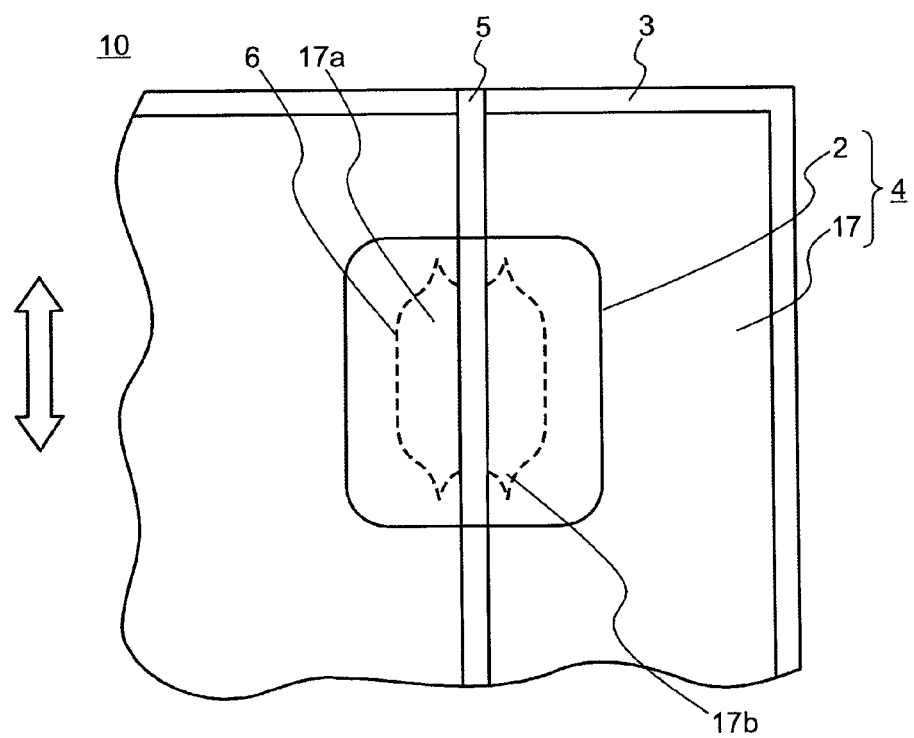
FIG. 13 is a schematic diagram of a silver electrode of the solar-cell panel that has a curved surface.

FIG. 12 is a perspective view of a solar-cell panel that has a curved surface. FIG. 13 is a schematic diagram of an electrode of the solar-cell panel with a curved surface shown in FIG. 12.

The solar-cell panel with the curved surface shown in FIG. 12 can be set in different places, and design and utility value of the solar-cell panel can be improved. However, at the time of manufacturing the solar-cell panel with a curved surface, the solar cells 10 need to be bent for mounting, and possibility of damage to the solar cells 10 is proportionately high. Even when there is no damage to the solar cells 10 at the time of mounting, a residual stress is generated, and when pressure is applied to the solar-cell panel, the solar cells 10 are damaged even with a small pressure. Furthermore, when the thickness of a plate for the solar cells 10 is the same, the curvature of the bend can be improved as the bending strength is higher and design flexibility is improved accordingly. Therefore, it is important to improve the strength of the solar cells 10 at the time of manufacturing the solar-cell panel with curved surface.

In the solar-cell panel shown in FIG. 12, the principal stress is generated in the direction indicated by an outline arrow. The bending strength of the solar cell 10 can be improved by providing an aluminum electrode 17 with an opening 17a and a notch 17b that recesses in a concave shape parallel to the direction of the principal stress that acts from the opening 17a in the plane of the silicon substrate 3, i.e., in a direction parallel to the direction in which the electric wire 5 is extended as shown in FIG. 13.

In the solar cell 10 according to the first embodiment, the silver electrode 2 is formed to cover the opening 1a and the notch 1b, and portion around the opening 1a and the notch 1b of the aluminum electrode 1. The silver electrode 2 needs only to cover at least the opening 1a and the notch 1b of the aluminum electrode 1, and at least a part of the portion around the opening 1a and the notch 1b. As the area where the silver electrode 2 and the aluminum electrode 1 overlap each other is larger, resistance is reduced. The form of the opening 1a and the base 2a of the silver electrode 2 need not be substantially square. The form of the opening 1a of the aluminum electrode 1 and the base 2a of the silver electrode 2 can be of shapes such as substantially circular, and substantially oval.

According to the first embodiment, the first electrode for collecting electricity from the rear surface of the silicon substrate 3 is the aluminum electrode 1 made of aluminum, and the second electrode for taking out output from the first electrode is the silver electrode 2 made of silver. However, material of the first electrode is not limited to aluminum but can be any kind of metal with high conductivity that is connected to a silicon layer for taking out electrical output. Material of the second electrode is not limited to silver but can be any kind of metal that reacts with the metal of the first electrode to take out electrical output from the first electrode, and can be solder-joined.

Second Embodiment

Figure 14:
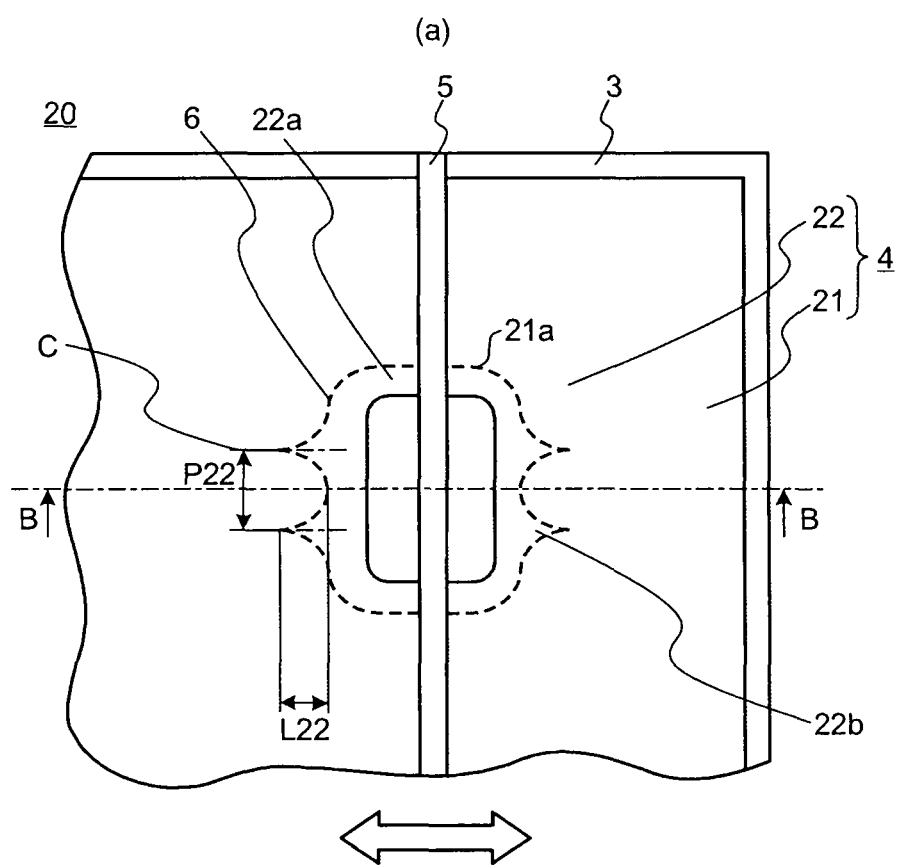
FIG. 14 is a schematic diagram of an electrode on the rear surface of a solar cell according to a second embodiment of the present invention.
Figure 14:
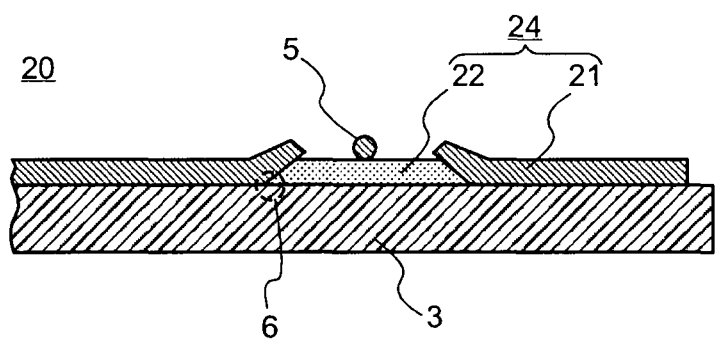

FIG. 14 is a schematic diagram of an electrode on the rear surface of a solar cell according to a second embodiment of the present invention. In FIG. 14, (a) is an enlarged view of the electrode on the rear surface of the solar cell, and (b) is a cross section taken along the line B-B of (a) of FIG. 14.

Figure 15:
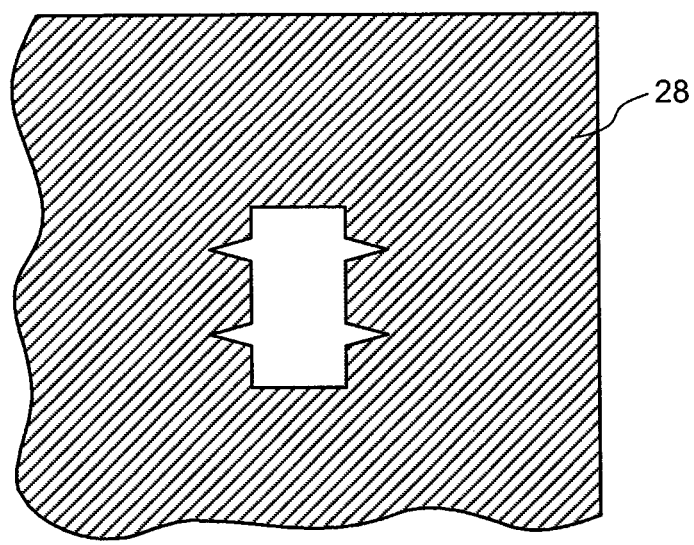
FIG. 15 is a top view of a mask used for printing silver paste in the process of forming the solar cell according to the second embodiment of the present invention.
Figure 16:
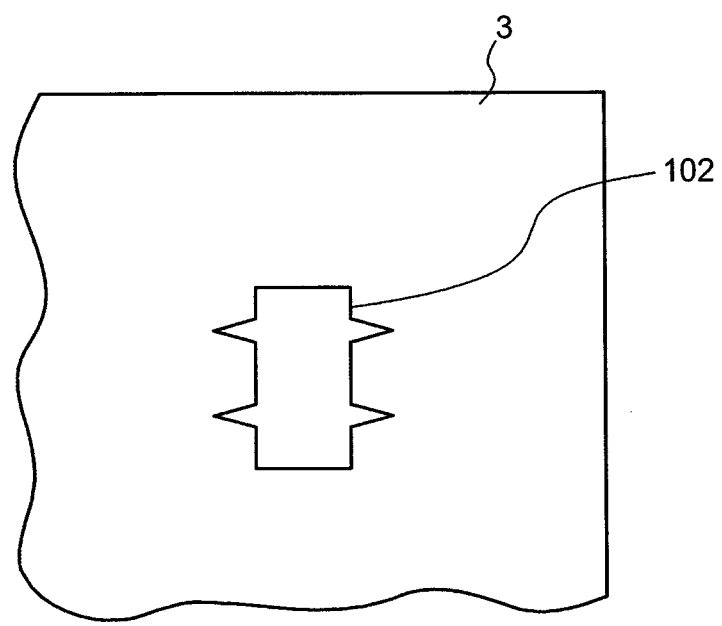
FIG. 16 is a schematic diagram of a silver electrode on the rear surface of the solar cell at the time of printing silver paste according to, the second embodiment of the present invention.
Figure 17:
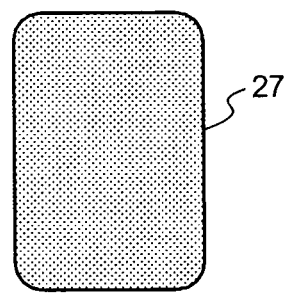
FIG. 17 is a top view of a mask used for printing aluminum paste in the process of forming the solar cell according to the second embodiment of the present invention.
Figure 18:
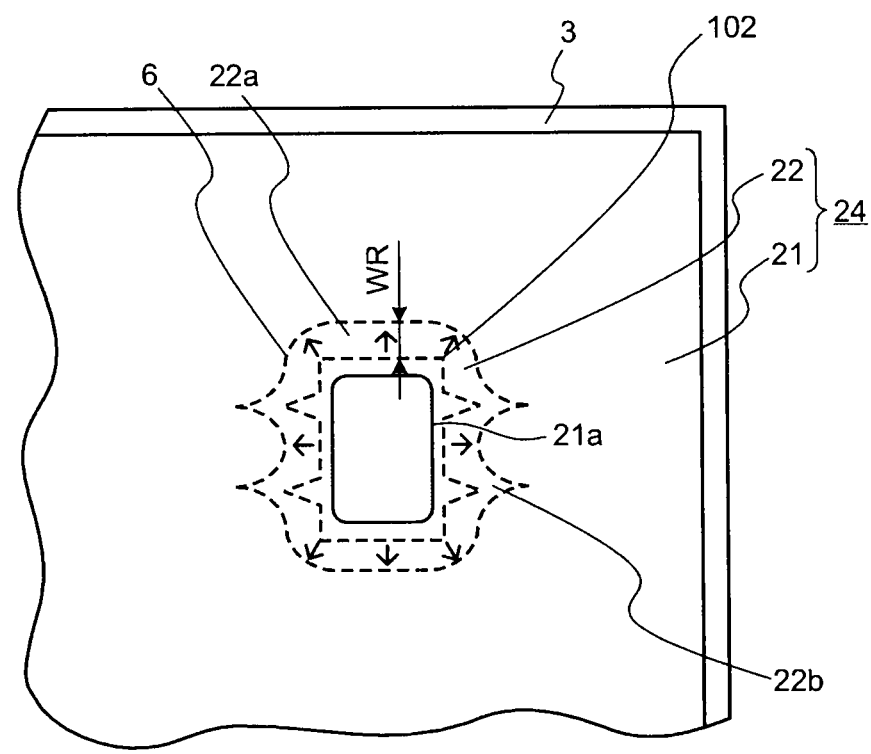
FIG. 18 is a schematic diagram of an aluminum electrode on the rear surface of the solar cell according to the second embodiment of the present invention.

FIG. 15 is a top view of a mask used for printing silver paste in the process of forming the silver electrode on the rear surface of the solar cell according to the second embodiment of the present invention. FIG. 16 is a schematic diagram of a silver electrode on the rear surface of the solar cell at the time of printing silver paste according to the second embodiment of the present invention. FIG. 17 is a top view of a mask used for printing aluminum paste in the process of forming the solar cell according to the second embodiment of the present invention. FIG. 18 is a schematic diagram of an aluminum electrode on the rear surface of the solar cell according to the second embodiment of the present invention.

In FIG. 14, a silver electrode 22 (second electrode) includes a substantially square base 22a to connect to the electric wire 5 and protruding portions 22b that are formed on a pair of facing sides of the base 22a and are protruding perpendicular to the direction in which the electric wire 5 is extended in a plane of the silicon substrate 3. The protruding portions 22b are of substantially symmetrical about an axis of a central line C. The central line C of the protruding portion 22b formed on one side of the base 22a and the central line C of the protruding portions 22b formed on the other facing side of the base 22a are on the same straight line, and the silver electrode 22 is substantially symmetrical about an axis of the electric wire 5. In FIG. 14, P22 is a distance between the central lines C of the adjacent protruding portions 22b and are on the same side of the base 22a. L22 is length of the protruding portion 22b from an opening 21a in a direction perpendicular to the direction in which the electric wire 5 is extended.

In FIG. 14, an aluminum electrode 21 (first electrode) includes the substantially square opening 21a that is located at a position corresponding to the center of the silver electrode 22 so that the silver electrode 22 touches the electric wire 5. The aluminum electrode 21 is located in such a manner that it covers the fringe portion of the base 22a of the silver electrode 22 and the protruding portions 22b for conduction with the silver electrode 22. Otherwise, the solar cell according to the second embodiment is of the same configuration, and functions in the same manner as the solar cell 10 in the first embodiment.

Explained below is a method of manufacturing an electrode 24 on the rear surface of a solar cell 20 according to the second embodiment of the present invention.

In the second embodiment of the present invention, first, silver paste is printed on the rear surface of the silicon substrate 3 by using a silver-paste printing mask 28 shown in FIG. 15, and the silver electrode 102 is formed as shown in FIG. 16. Next, on the rear surface of the silicon substrate 3, on which the silver electrode 102 has been formed, aluminum paste is printed by using an aluminum-paste printing mask 27 shown in FIG. 17, and is formed into the aluminum electrode 21 with the substantially square opening 21a as shown in FIG. 18. Thereafter, the aluminum electrode 21 is fired to form the electrode 24 on the rear surface of the solar cell 20. After the aluminum electrode 21 is formed, at the time of firing, the silver paste spreads in directions shown by arrows from the form 102 determined by the silver-paste printing mask 28. At this time, a fragile part where three metals, silicon, silver, and aluminum, are alloyed together is formed around the border portion 6 shown in FIG. 18. The silver electrode 22 directly contacts on the silicon substrate 3 inside the border portion 6. A portion where the silver electrode 22, having spread from the form 102 defined by the silver-paste printing mask 28 when fired, reacts with the aluminum electrode 21, as shown in FIG. 18, is referred to as reaction width WR. Generally, when the aluminum paste and the silver paste are fired at the same time, the reaction width WR is of 0.3 mm to 1.0 mm as in the first embodiment. The silver paste spreads from the form determined by the silver-paste printing mask 28 by the reaction width WR. Thus, the silver electrode 22 as shown in FIGS. 14 and 18 is formed.

When the 4-point bending test was conducted with respect to the solar cell 20 in the second embodiment, the results were the same as those obtained in the case of the solar cell 10 in the first embodiment.

The solar cell 20 according to the second embodiment has the silver electrode 22 that includes the base 22a and the protruding portions 22b protruding from the base 22a perpendicularly to the direction in which the electric wire 5 is extended in a plane of the silicon substrate 3, i.e., the direction parallel to the direction of the principal stress. The aluminum electrode 21 has the opening 21a on the central portion of the silver electrode 22 and covers portion around the base 22a of the silver electrode 22 and the protruding portion 22b. Therefore, the border portion 6 formed of the fragile alloy of three different metals is formed of comparatively short lines. The fragile alloy of three different metals is likely to be a point of fracture similarly to a crack in the case of silicon substrate. However, because the border portion 6 is formed of the short lines due to the protruding portion 22b, a long linear portion, which can form large cracks, is not formed, and breakage is not likely to develop at the border portion 6. Therefore, the electrode 24 can be manufactured without suppressing reaction between the aluminum electrode 21 and the silver electrode 22, and the bending strength and the yield can be improved without increased resistance from the electrode 24. Specifically, when the bending stress acts on the electric wire 5 as the base point, because the protruding portions 22b are formed on each of the facing sides of the base 22a and are protruding perpendicular to the direction in which the electric wire 5 is extended in a plane of the silicon substrate 3, the bending strength and the yield of the solar cell 20 can be improved. In the solar cell 20 according to the second embodiment of the present invention, because firing process is sufficient once after the formation of the aluminum electrode 21, steps in the manufacturing process can be reduced and cost of manufacturing can be reduced as the firing process is not needed twice, i.e., once after the formation of the aluminum electrode and once after the formation of the silver electrode.

Figure 19:
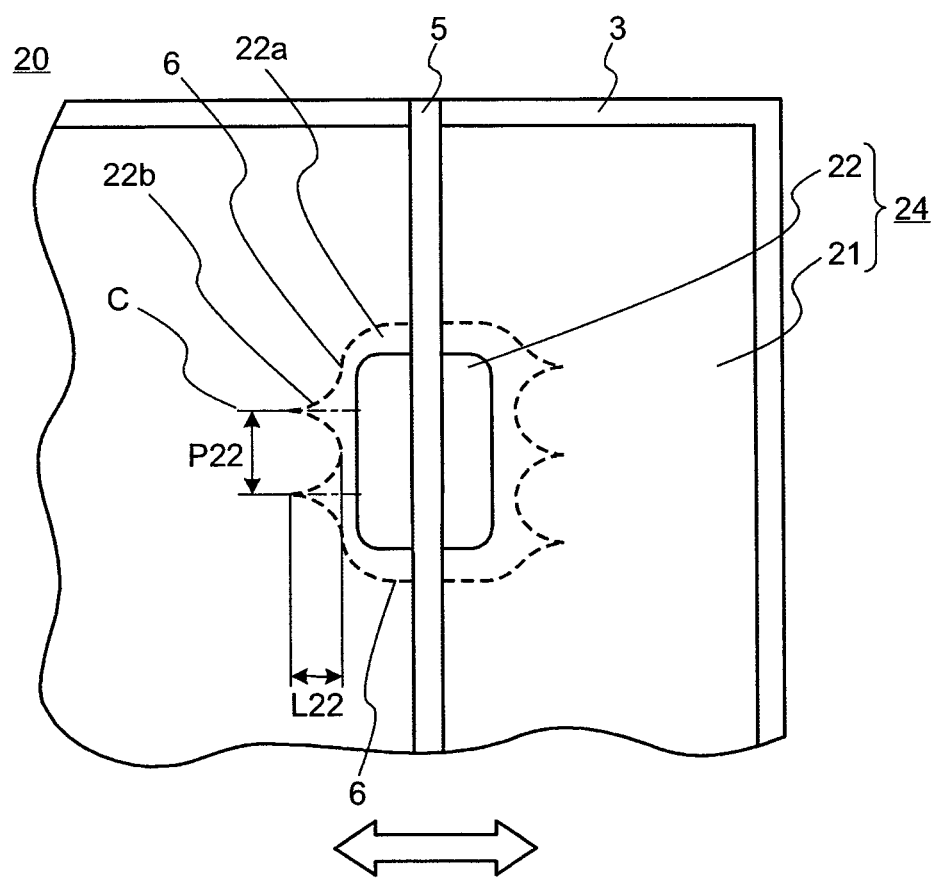
FIG. 19 is a schematic diagram of the aluminum electrode on the rear surface of the solar cell according to the second embodiment of the present invention.

FIG. 19 is a schematic diagram of an electrode on the rear surface of a solar cell that has a silver electrode different from that included in the solar cell shown in FIG. 14.

The solar cell 20 shown in FIG. 19 is the same as the solar cell 20 in FIG. 14 as regards the following points: the silver electrode 22 includes the base 22a to connect to the electric wire 5 and the protruding portions 22b that are formed on both sides of the base 22a and are protruding perpendicular to the direction in which the electric wire 5 is extended in a plane of the silicon substrate 3. However, the solar cell 20 is different from the one shown in FIG. 14 as regards the following points: the central line C of the protruding portions 22b formed on one side of the base 22a and the central line C of the protruding portions 22b formed on another side of the base 22a are not on the same straight line. In the solar cell 20 shown in FIG. 19, because the central line C of the protruding portions 22b formed on one side of the base 22a and the central line C of the protruding portions 22b formed on another side of the base 22a are not on the same straight line, breakage is not likely to occur at a link between the protruding portions 22b formed on both sides of the base 22a, which improves the bending strength of the solar cell 20.

As shown in FIG. 19, P22, which is a distance between the central lines C of the adjacent protruding portions 22b on the same side of the base 22a, is preferred to be longer than twice the reaction width WR and shorter than six times the reaction width WR. When the distance P22 between the central lines C is less than twice the reaction width WR, the adjacent protruding portions 22b overlap each other whereby the protruding portions 22b are not able to distribute the stress, due to which the bending strength is deteriorated. When distance P22 between the central lines C of the adjacent protruding portions 22b is longer than six times the reaction width WR, the adjacent protruding portions 22b become far apart whereby the linear portion of alloy of three metals becomes longer, due to which the bending strength is deteriorated. Therefore, if the distance P22 between the central lines C of the adjacent protruding portions 22b is longer than twice the reaction width WR and is shorter than six times the reaction width WR, the bending strength of the solar cell 20 is improved without an increase in resistance of the electrode 24. It is better to have as many of the protruding portions 22b on one side of the base 22a as possible.

As shown in FIG. 19, the length L22 of the protruding portions 22b from the base 22a is preferred to be longer than the reaction width WR and shorter than three times the reaction width WR. When, in the base 22a of the silver electrode 22, the length of a side parallel to the direction in which the electric wire 5 is extended is longer, the length of the linear portion of the border portion 6 where the fragile alloy of three different metals is formed becomes longer. Thus, the border portion 6 becomes easily breakable, which leads to deterioration in the bending strength. Therefore, it is preferable to form the protruding portions 22b by combining arcs of 90 degrees, and most preferable length L22 of the protruding portions 22b is half the length of the distance P22 between the central lines C of the protruding portions 22b. If the length L22 of the protruding portions 22b is longer than the reaction width WR and is shorter than three times the reaction width WR, deterioration of the bending strength of the solar cell 20 can be prevented.

The solar cell 20, according to the second embodiment, has the silver electrode 22 that includes the protruding portions 22b protruding from the base 22a perpendicularly to the direction in which the electric wire 5 is extended in a plane of the silicon substrate 3. However, the principal stress that acts on the solar cell 20 is not limited to the bend at the electric wire 5 as the base point. The direction of the principal stress, which is the main cause of damage to the solar cell 20, varies according to the form and usage of the solar-cell panel. Therefore, by obtaining the direction of the principal stress, which is the main cause of damage to the solar cell 20, and providing the silver electrode 22 with the protruding portions 22b that protrude from the base 22a parallel to the direction of the principal stress in a plane of the silicon substrate 3, the bending strength of the solar cell 20 can be improved. The direction of the principal stress, which is the main cause of damage to the solar cell 20, can be obtained by using versatile finite element technique analysis software. According to the second embodiment, the protruding portions 22b are formed on both sides of the electrode because bending deformation is assumed and direction of the principal stress is constant. However, for example, thermal stress, generated at the time of soldering an electrode to a copper plate that connects the solar cells, changes according to the form of the copper plate, and, in some cases, the principal stress is concentrated on one side of an electrode or the principal stress is generated on all four sides taking the electrode as a center. The direction of the principal stress of the thermal stress can also be obtained by using versatile finite element technique analysis software. The bending strength of the solar cell 20 can be improved by setting the electrode that includes the protruding portions protruding in parallel to the direction of the principal stress on a side in which the thermal stress is generated.

When the solar cell 10 according to the first embodiment is compared with the solar cell 20 according to the second embodiment, if the size of the border portion 6 where the fragile alloy of three different metals is formed is the same, a larger area for soldering the silver electrode can be ensured in the solar cell 10 according to the first embodiment than the one in the solar cell 20 according to the second embodiment.

In the solar cell 20 according to the second embodiment, as shown in FIG. 14, the aluminum electrode 21 is configured to cover peripheral portion of the base 22a and the protruding portion 22b of the silver electrode 22. However, the aluminum electrode 21 is only required to cover at least the protruding portions 22b and at least a part of the peripheral portion of the base 22a. As area where the silver electrode 2 and the aluminum electrode 1 overlap each other is larger, resistance decreases. Furthermore, the form of the opening 21a of the aluminum electrode 21 and the base 22a of the silver electrode 22 is not necessarily substantially square, but can be of shapes such as substantially circular, substantially oval.

The invention claimed is:

1. A solar cell comprising:
a substrate;
a first electrode that collects electricity from a first surface of the substrate; and
a second electrode that receives an output from the first electrode, wherein the second electrode includes:
a base that is substantially square and that is formed on the first surface of the substrate; and
at least one protruding portion that protrudes from a pair of facing sides of the base parallel to a direction of principal stress in a plane of the substrate, each protruding portion including at least two protruding points extending from the base with the protruding points each substantially symmetrical about an axis of a central line passing through the protruding points and with a non-extending portion between the at least two protruding points;
the first electrode includes an opening at a position corresponding to a center of the base of the second electrode; and
the first electrode covers at least a fringe of the base portion of the second electrode, and covers the protruding portion of the second electrode.

2. The solar cell according to claim 1, wherein the protruding portion includes a first protruding portion formed on one of opposing sides of the base, and a second protruding portion formed on another of the opposing sides, and
a central line of the first protruding portion and a central line of the second protruding portion are not on a same straight line.

3. The solar cell according to claim 1, wherein
the protruding portion includes a first protruding portion formed on one side of the base, and a second protruding portion adjacent to the first protruding portion, and
a distance between centers of the first protruding portion and the second protruding portion is longer than twice a reaction width and is shorter than six times the reaction width, the reaction width being a width where the first electrode and the second electrode react with each other upon being fired.

4. The solar cell according to claim 1, wherein the protruding portion is longer than a reaction width and is shorter than three times the reaction width, the reaction width being a width where the first electrode and the second electrode react with each other upon being fired.

5. A solar cell comprising:
a substrate;
a first electrode that collects electricity from a first surface of the substrate;
a second electrode that receives an output from the first electrode; and
an electric wire that extends on the second electrode, wherein
the second electrode includes:
a base that is substantially square and that is formed on the first surface of the substrate; and
at least one protruding portion that protrudes from a pair of facing sides of the base in a direction perpendicular to a direction in which the electric wire extends in a plane of the substrate, each protruding portion including at least two protruding points extending from the base with the protruding points each substantially symmetrical about an axis of a central line passing through the protruding points and with a non-extending portion between the at least two protruding points;

the first electrode includes an opening at a position corresponding to center of the base of the second electrode, and the first electrode covers at least a fringe of the base portion of the second electrode, and covers the protruding portion of the second electrode.

6. The solar cell according to claim 5, wherein
the protruding portion includes a first protruding portion formed on one of opposing sides of the base, and a second protruding portion formed on another of the opposing sides, and
a central line of the first protruding portion and a central line of the second protruding portion are not on a same straight line.

7. The solar cell according to claim 5, wherein
the protruding portion includes a first protruding portion formed on one side of the base, and a second protruding portion adjacent to the first protruding portion, and
a distance between centers of the first protruding portion and the second protruding portion is longer than twice a reaction width and is shorter than six times the reaction width, the reaction width being a width where the first electrode and the second electrode react with each other upon being fired.

8. The solar cell according to claim 5, wherein the protruding portion is longer than a reaction width and is shorter than three times the reaction width, the reaction width being a width where the first electrode and the second electrode react with each other upon being fired.

9. A solar cell comprising:
a substrate;
a first electrode that collects electricity from a first surface of the substrate; and
a second electrode that receives an output from the first electrode, wherein the second electrode includes:
　a base that is substantially square and that is formed on the first surface of the substrate; and
　at least one protruding portion that protrudes from a pair of facing sides of a part of the base to extend beyond the base parallel to a direction of principal stress in a plane of the substrate, each protruding portion including at least two protruding points extending from the base with the protruding points each substantially symmetrical about an axis of a central line passing through the protruding points and with a non-extending portion between the at least two protruding points;
the first electrode includes an opening at a position corresponding to a center of the base of the second electrode, and
the first electrode covers at least the protruding portion of the second electrode.

10. The solar cell according to claim 9, wherein
the protruding portion includes a first protruding portion formed on one of opposing sides of the base, and a second protruding portion formed on another of the opposing sides, and
a central line of the first protruding portion and a central line of the second protruding portion are not on the same straight line.

11. The solar cell according to claim 9, wherein
the protruding portion includes a first protruding portion formed on one side of the base, and a second protruding portion adjacent to the first protruding portion, and
a distance between centers of the first protruding portion and the second protruding portion is longer than twice a reaction width and is shorter than six times the reaction width, the reaction width being a width where the first electrode and the second electrode react with each other upon being fired.

12. The solar cell according to claim 9, wherein the protruding portion is longer than a reaction width and is shorter than three times the reaction width, the reaction width being a width where the first electrode and the second electrode react with each other upon being fired.

13. A solar cell comprising:
a substrate;
a first electrode that collects electricity from a first surface of the substrate;
a second electrode that receives an output from the first electrode; and
an electric wire that extends on the second electrode, wherein
the second electrode includes:
　a base that is substantially square and that is formed on the first surface of the substrate; and
　at least one protruding portion that protrudes from a pair of facing sides of a part of the base to extend beyond the base in a direction perpendicular to a direction in which the electric wire extends in a plane of the substrate, each protruding portion including at least two protruding points extending from the base with the protruding points each substantially symmetrical about an axis of a central line passing through the protruding points and with a non-extending portion between the at least two protruding points;
the first electrode includes an opening at a position corresponding to a center of the base of the second electrode, and
the first electrode covers at least the protruding portion of the second electrode.

14. The solar cell according to claim 13, wherein
the protruding portion includes a first protruding portion formed on one of opposing sides of the base, and a second protruding portion formed on another of the opposing sides, and
a central line of the first protruding portion and a central line of the second protruding portion are not on the same straight line.

15. The solar cell according to claim 13, wherein
the protruding portion includes a first protruding portion formed on one side of the base, and a second protruding portion adjacent to the first protruding portion, and
a distance between centers of the first protruding portion and the second protruding portion is longer than twice a reaction width and is shorter than six times the reaction width, the reaction width being a width where the first electrode and the second electrode react with each other upon being fired.

16. The solar cell according to claim 13, wherein the protruding portion is longer than a reaction width and is shorter than three times the reaction width, the reaction width being a width where the first electrode and the second electrode react with each other upon being fired.

* * * * *